United States Patent
Kang et al.

(10) Patent No.: US 7,684,023 B2
(45) Date of Patent: Mar. 23, 2010

(54) APPARATUS AND METHOD FOR GENERATING THZ WAVE BY HETERODYNING OPTICAL AND ELECTRICAL WAVES

(75) Inventors: Kwang Yong Kang, Daejeon (KR); Mun Cheol Paek, Daejeon (KR); Doo Hyeb Youn, Daejeon (KR); Min Hwan Kwak, Daejeon (KR); Suk Gil Han, Daejeon (KR)

(73) Assignee: Electronics and Telecommunications Research Institute, Daejeon (KR)

( * ) Notice: Subject to any disclaimer, the term of this patent is extended or adjusted under 35 U.S.C. 154(b) by 319 days.

(21) Appl. No.: 11/759,493

(22) Filed: Jun. 7, 2007

(65) Prior Publication Data
US 2008/0137093 A1     Jun. 12, 2008

(30) Foreign Application Priority Data
Dec. 7, 2006     (KR)    ............... 10-2006-0124125

(51) Int. Cl.
| | |
|---|---|
| G01N 21/00 | (2006.01) |
| G02B 27/32 | (2006.01) |
| G01B 9/02 | (2006.01) |
| A61N 5/00 | (2006.01) |
| G21G 5/00 | (2006.01) |
| G01R 31/26 | (2006.01) |

(52) U.S. Cl. ............... 356/73.1; 356/256; 356/432; 356/484; 250/492.1; 324/765

(58) Field of Classification Search .................. None
See application file for complete search history.

(56) References Cited

U.S. PATENT DOCUMENTS

| | | | | |
|---|---|---|---|---|
| 5,304,794 | A | * | 4/1994 | Malone et al. .......... 250/214 R |
| 5,371,588 | A | * | 12/1994 | Davis et al. ............... 356/489 |
| 5,663,639 | A | | 9/1997 | Brown et al. |
| 5,729,017 | A | * | 3/1998 | Brener et al. ............. 250/338.1 |
| 6,417,505 | B1 | * | 7/2002 | Han et al. ................ 250/216 |
| 6,873,165 | B2 | * | 3/2005 | Lee et al. ................ 324/750 |

(Continued)

FOREIGN PATENT DOCUMENTS

JP     6-137847 A     5/1994

(Continued)

OTHER PUBLICATIONS

Daipayan Bhattacharya, Hernan Erlig, Mohammed E. Ali, Shamino Wang, Harold R. Fetterman, Richard Lai, and Dwight C. Streit, "The Optical Response of Epitaxial Lift-Off HEMT's to 140 GHz," IEEE Journal of Quantum Electronics, vol. 33, No. 9, Sep. 1997, p. 1507-1516.

(Continued)

*Primary Examiner*—Tarifur Chowdhury
*Assistant Examiner*—Gordon J Stock, Jr.
(74) *Attorney, Agent, or Firm*—Rabin & Berdo, PC

(57) ABSTRACT

An apparatus and method for generating a terahertz (THz) wave are provided. The apparatus comprises: an fiber optic probe injecting an optical wave transmitted through an optical fiber into a device under test (DUT); a driving oscillator generating and injecting an electrical wave into the DUT; and the device under test (DUT) generating a THz wave using the produced optical and electrical waves.

9 Claims, 4 Drawing Sheets

U.S. PATENT DOCUMENTS 7,511,512 B2 * 3/2009 Sekiguchi .................. 324/638
2004/0095147 A1 * 5/2004 Cole .......................... 324/629

FOREIGN PATENT DOCUMENTS

| JP | 2005-195382 A | 7/2005 |
| KR | 2001-0008923 | 2/2001 |
| KR | 1020010008923 | 2/2001 |

OTHER PUBLICATIONS

M. E. Ali, K. Geary, H. R. Fetterman, S. K. Han, and K. Y. Kang, Characterization of Ultrafast Devices Using Near-Field Optical Heterodyning, IEEE Microwave and Wireless Components Letters, vol. 12, No. 10, Oct. 2002, p. 369-371.

* cited by examiner

APPARATUS AND METHOD FOR GENERATING THZ WAVE BY HETERODYNING OPTICAL AND ELECTRICAL WAVES

CROSS-REFERENCE TO RELATED PATENT APPLICATION

This application claims the benefit of Korean Patent Application No. 10-2006-0124125, filed on Dec. 7, 2006, in the Korean Intellectual Property Office, the disclosure of which is incorporated herein in its entirety by reference.

BACKGROUND OF THE INVENTION

1. Field of the Invention

The present invention relates to an apparatus and a method for generating a terahertz (THz) wave, and more particularly, to an apparatus and a method for generating a THz wave by heterodyning optical wave and electrical wave.

2. Description of the Related Technology

Terahertz (THz) waves can be generated by photo-mixing using a fiber optic probe (FOP) and an objective lens. The photo-mixing is performed by injecting the coupled laser beams into a high-speed and high-frequency semiconductor device through an optical lens or a single-mode optical fiber, and generating and detecting microwave and THz waves. However, in this case, because the diameter of the laser beam is much larger than semiconductor devices, degradation of the stability of a detected signal and the high noise figure arises from lack of the device accessibility and scanning performance of FOP.

THz waves can also be generated by heterodyning two optical waves. The heterodyning of the two optical waves is performed by injecting optical beams with frequencies $\omega_1$ and $\omega_2$ come from two lasers into a near-field fiber optic probe (NFOP) using an optical coupler. Then, through the interaction between a high-speed and high-frequency device and an optical wave of a frequency $\omega_b$ ($=\omega_1 - \omega_2$) come from a probe tip (end) with a diameter of less than 0.1 μm, a millimeter wave with a frequency ($\omega_b/2\pi$) corresponding to the above-described frequency difference ($\omega_1 - \omega_2$) is generated and detected. Thereby, from this method, the resolution and noise figure of the mixed light are improved.

However, it is found that using the high-speed and high-frequency InP-based hetero-junction bipolar transistor (HBT), whenever high frequency characteristics are measured under 1 THz, the practical characteristics are considerably different from the simulated results. Therefore, the heterodyne method of two optical waves has limitations to evaluate characteristics of high-speed and high-frequency devices in a range from 0.1 to 10 THz.

SUMMARY OF THE INVENTION

The present invention provides an apparatus and method for generating a terahertz (THz) wave with wide tunability in a THz region, high frequency stability, and high propagation quality by heterodyning optical and electrical waves using a near-field fiber optic probe (NFOP).

According to an aspect of the present invention, an apparatus for generating a terahertz (THz) wave is provided and the apparatus comprising: an fiber optic probe (FOP) injecting an optical wave transmitted through an optical fiber into a device under test (DUT); a driving oscillator generating and injecting an electrical wave into the DUT; and the device under test (DUT) generating a THz wave using the injected optical and electrical waves.

According to another aspect of the present invention, a method of generating a THz wave is provided and the method comprising: setting a reference point to adjust a distance between a DUT and an fiber optic probe; and positioning the FOP at the reference point, and injecting an optical wave in a first direction into the fiber optic probe to scan the DUT while injecting an electrical wave in a second direction into the DUT to generate a THz wave.

BRIEF DESCRIPTION OF THE DRAWINGS

The features and advantages of the present invention will become more apparent by describing exemplary implementations in detail, thereof with reference to the attached drawings in which.

DETAILED DESCRIPTION OF THE INVENTION

The present invention will now be described more fully with reference to the accompanying drawings, in which exemplary implementations of the invention are shown.

Figure 1:
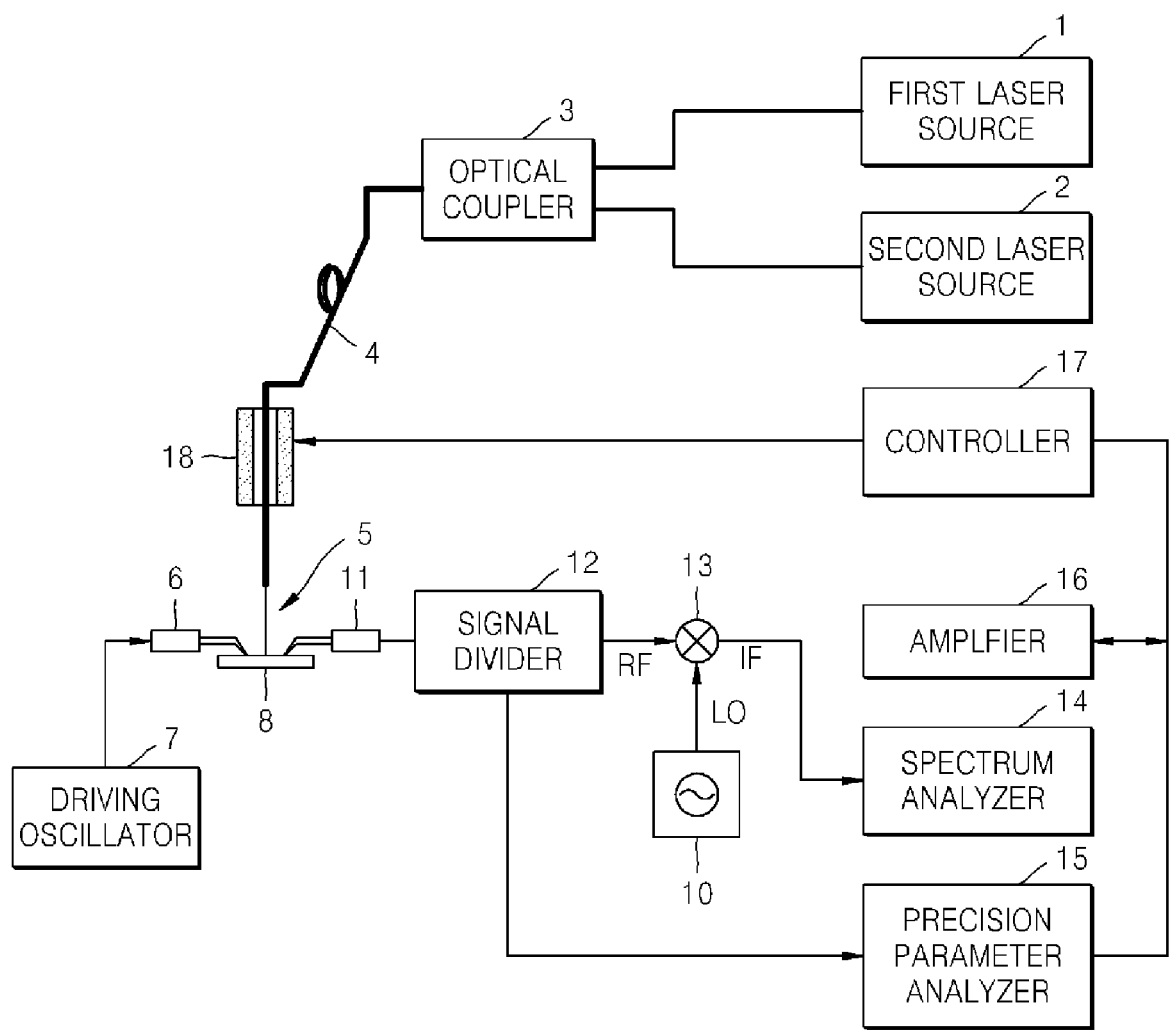
FIG. 1 shows a schematic diagram of the apparatus for generating a terahertz (THz) wave by heterodyning optical and electrical waves according to an embodiment of the present invention.

FIG. 1 shows a schematic diagram of an apparatus for generating a terahertz (THz) wave by heterodyning optical and electrical signals according to an embodiment of the present invention.

The apparatus for generating the THz wave includes first and second laser sources 1 and 2, an optical coupler 3, an optical fiber 4, a fiber optic probe 5, a 100 GHz W-band probe 6, and a driving oscillator 7.

In FIG. 1, reference numeral 8 denotes a device under test (DUT).

Furthermore, FIG. 1 illustrates a THz wave detecting system including a 200 GHz G-band probe 11, a Bias-Tee as a signal divider 12, a local oscillator 10, a mixer 13, and a spectrum analyzer 14, which detects a THz wave generated by the THz wave generating apparatus.

In addition, a precision parameter analyzer 15, a lock-in amplifier as an amplifier 16, a controller with GPIB (General Purpose Interface Bus) 17, and a precision actuator as an actuator 18 may be further provided to adjust a distance between the fiber optic probe 5 and the DUT 8 and to obtain a THz wave in the range of the desired frequency band according to the detection result.

The first and second laser sources 1 and 2 generates optical beams having different frequencies $\omega_1$ and $\omega_2$ required for the generation of a THz wave. The optical coupler 3 combines the two optical beams to generate an optical wave with a frequency $\omega_b$ ($=\omega_1 - \omega_2$). The optical coupler 3 may be a 2×2 coupler. One come from the optical coupler 3 is injected into the fiber optic probe (FOP) 5 through the optical fiber 4, and the other from the optical coupler 3 is fed to an optical spectrum analyzer (not shown here) to monitor optical power or frequency.

The optical fiber 4 may be a low-loss optical fiber, and the fiber optic probe 5 may be a near-field fiber optic probe (NFOP) formed at an end of the optical fiber 4 attached to the actuator 18.

Since a tapered tip of the FOP 5 has a sub-micron diameter, the optical wave incident a surface of the DUT 8 has a sub-micron diameter and a minimum resolution of 20 nm approximately. A distance between the tapered tip of the FOP 5 and the DUT 8 may be 0.1 µm.

In order to obtain a THz wave with wide tunability, high frequency stability, and high propagation quality including high resolution and low noise figure, a millimeter wave generated by the driving oscillator 7 with a 100 GHz W-band probe 6 as well as the optical wave is injected into the DUT 8. The optical wave and the millimeter wave injected into the DUT 8 are heterodyned to generate a THz wave or sub-THz wave.

Figure 2:
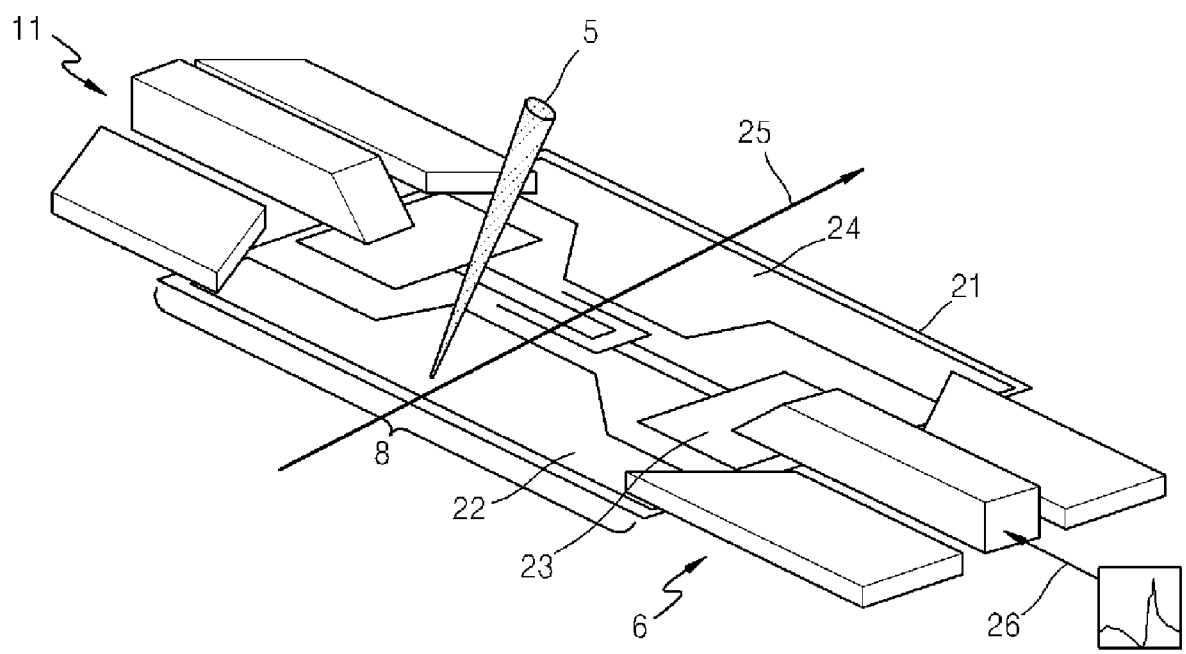
FIG. 2 illustrates a perspective view of a device under test (DUT) for the apparatus of FIG. 1.

FIG. 2 is a perspective view of the DUT 8 of FIG. 1. The DUT 8 is a hetero-junction bipolar transistor (HBT) fabricated on an InP substrate 21 and may have a double gate structure to obtain a precise output.

When the optical wave of frequency $\omega_b$ is incident to DUT 8 through the fiber optic probe (FOP) 5, the FOP 5 may be located at a predetermined point of the HBT 8 or may scan across a source (collector) 22, a gate (base) 23, and a drain (emitter) 24 in an arrow direction 25 or a direction opposite to the arrow direction 25.

The millimeter wave generated by the driving oscillator 7 is injected in an arrow direction 26 through the W-band probe 6. For reference, the W-band probe 6 is a high-frequency coplanar probe with microelectrode of an approximately 5 µm diameter and with a contact electrode of a few microns in size.

Figure 3A:
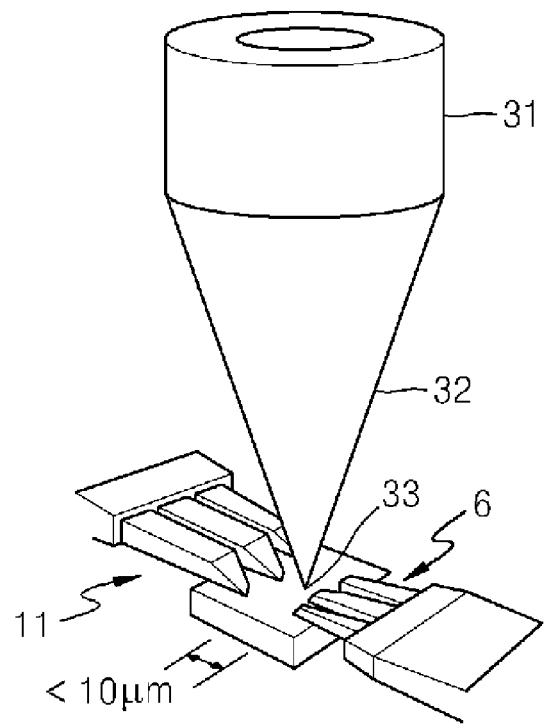
FIGS. 3A and 3B are perspective views illustrating a fiber optic probe according to an embodiment of the present invention and a conventional fiber optic probe, respectively.
Figure 3B:
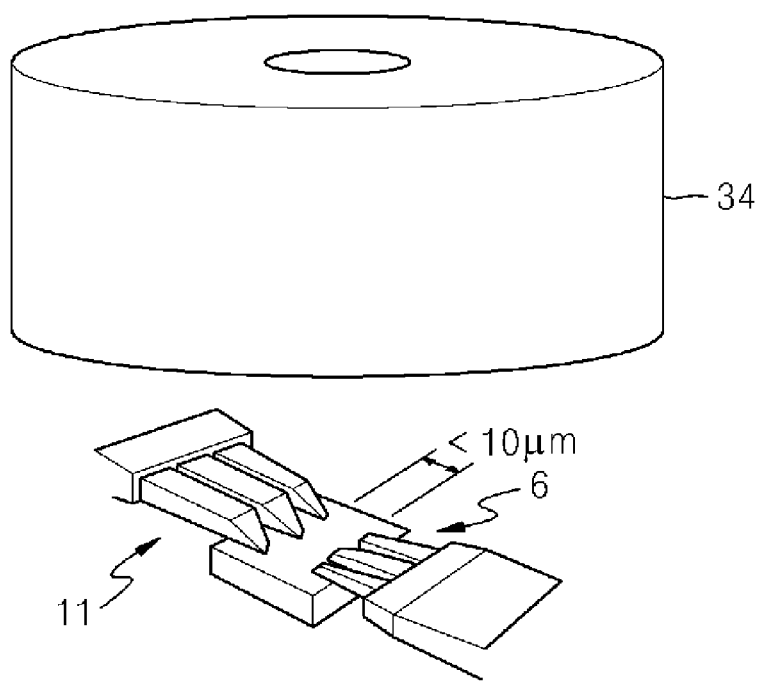

FIGS. 3A and 3B are perspective views of the fiber optic probe (FOP) 5 according to an embodiment of the present invention and a conventional FOP 34, respectively. Referring to FIG. 3A, the FOP 5 according to the present embodiment includes an optical waveguide 31, a tapered fiber region 32, and a tip 33. The optical wave may be transmitted through the optical waveguide 31 without loss. The tip 33 has a diameter much smaller than the wavelength of the optical wave. Since the tip 33 which the optical wave passes out has a diameter of 0.1 µm, a beam of the optical wave incident on the HBT 8 has a diameter less than 0.1 µm. Referring to FIG. 3B, the conventional FOP 34 has an inner diameter from 10 to 20 µm and the wave length of the optical wave is much longer than a size of the DUT 8. Accordingly, lack of the device accessibility and scanning performance, degradation of the stability of a detected signal and the high noise figure arises.

Fiber optic probes have been conventionally used only in imaging and spectroscopy of ultra-small electronic devices. However, since the near-field fiber optic probe (NFOP) 5 according to the present invention has a diameter from 0.05 to 0.1 µm, the NFOP 5 can not only verify the circuit pattern of the high-speed and high-frequency devices but also generate and detect a high frequency wave through photo-mixing method. Consequently, the NFOP 5 according to the present invention can be developed as a key component in the field of THz wave photonics, such as a high-resolution and ultra-small switch.

The THz wave generated by heterodyning the optical and electrical waves can be detected by the G-band probe 11. The G-band probe 11 can tap a 200 GHz signal.

The signal divider 12 divides the THz wave tapped by the G-band probe 11 into an RF signal and a low frequency signal, and may employ a bias tee.

The divided RF signal is mixed with an output signal of the local oscillator 10 by the mixer 13 and converted into an intermediate frequency (IF) signal. The frequency characteristics of the converted IF signal are analyzed by the spectrum analyzer 14.

Figure 4:
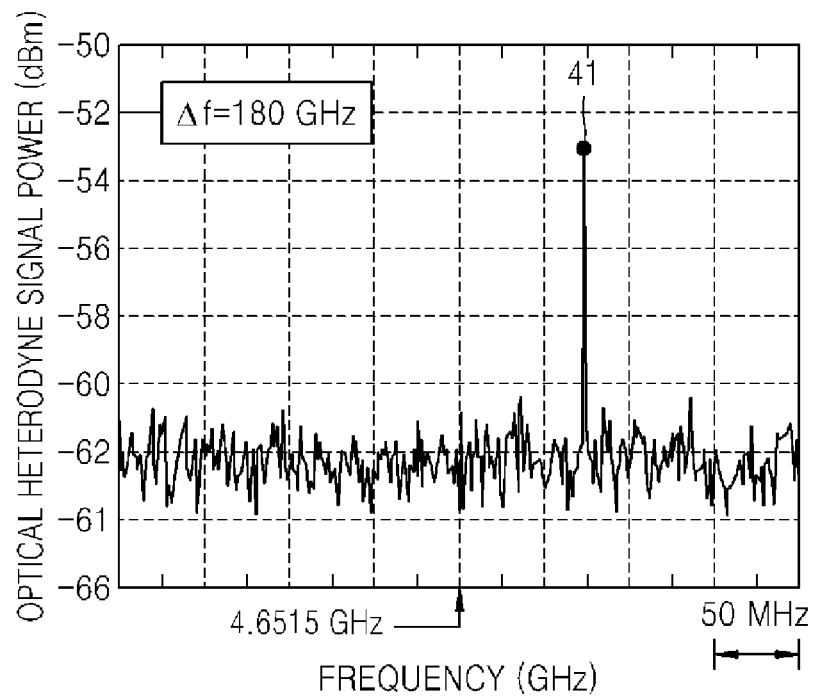
FIG. 4 shows the optical response characteristics of a THz wave shown through a spectrum analyzer.

FIG. 4 shows the optical response characteristics of IF signal converted from the THz wave as shown in the spectrum analyzer 14. Namely, the optical response characteristics are obtained by down-converting the THz wave of 180 GHz through the G-band probe 11 into the IF frequency. Referring to FIG. 4, the THz wave, namely, a down-converted peak is detected at a reference numeral 41.

Meanwhile, a photocurrent is measured from the down-converted low frequency signal using the precision parameter analyzer 15. A value of the photocurrent measured by the precision parameter analyzer 15 reflects the distance between the tip 33 and the DUT 8. The distance between the tip 33 and the DUT 8 can be adjusted to be approximately 0.1 µm according to the shear force feedback principle.

The photocurrent $i_{tot}(t)$ measured by the precision parameter analyzer 15 is given by $$i_{tot}(t) = A\cos(\omega_b t) \cdot B\cos(\omega_g t) \qquad (1)$$
$$= \frac{A \cdot B}{2}[\cos(\omega_b + \omega_g)t + \cos(\omega_b - \omega_g)t]$$

where A and B are constants, and $\omega_b$ and $\omega_g$ denote the frequencies of the optical wave incident on the DUT 8 and the THz wave come from the G-band probe 11, respectively.

In consequence of Equation 1, an up-converted frequency and a down-converted frequency are produced through the modulation of the total photocurrent.

The amplifier 16 amplifies the photocurrent measured by the precision parameter analyzer 15, and may be a low noise lock-in amplifier.

The control unit with GPIB 17 sets a reference point to adjust the distance between the fiber optic probe (FOP) 5 and the DUT 8, more precisely, between the tip 33 and the DUT 8. Next, the control unit with GPIB 17 drives the actuator 18 to position the FOP 5 at the reference point. When the THz wave is generated from the DUT 8, the controller 17 drives the actuator 18 with reference to an output from the amplifier 16 to control the distance between the FOP 5 and the DUT 8. The actuator 17 may be a nano-precision actuator including a small vibrator.

Figure 5:
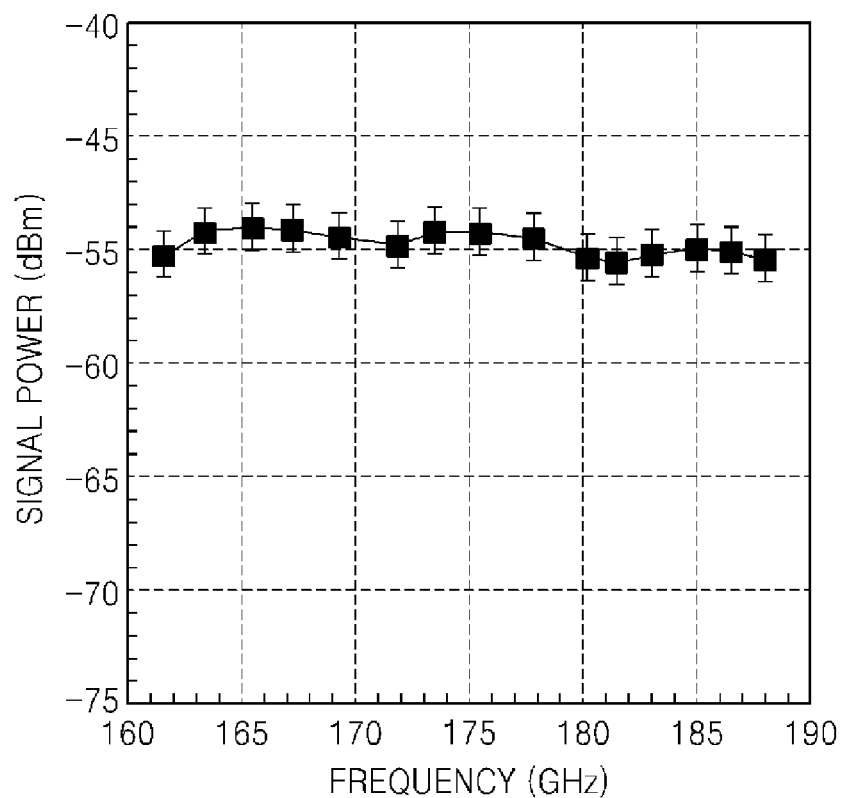
FIG. 5 illustrates the optical response characteristics (tunability and stability) of a THz wave generated according to the present invention.

FIG. 5 shows the optical response characteristics of a THz wave generated by the present invention, showing signal power (dBm) as a function of frequency in the ranging from 160 to 190 GHz. Referring to FIG. 5, the power is almost maintained as a constant value of 55 dBm over a wide frequency band of about 30 GHz.

Therefore, it can be noted that wide-band tunability and high-frequency stability are obtained.

According to the present invention, since THz waves are generated by heterodyning optical and electric waves, the THz waves have high frequency stability and high propagation quality, namely high resolution and low noise figure.

Furthermore, since the near-field fiber optic probe (NFOP) is controlled by the nano-precision actuator, there is no need to use a conventional optical microscope to adjust the position of the fiber optic probe (FOP).

Moreover, utilization of the THz wave range defined as a frequency from 0.1 to 10 THz using a high-speed and high-frequency electronic devices can be facilitated, the apparatus or receiver etc. for generating and/or detecting a THz wave can be miniaturized, a high frequency source can be developed, and a THz wave electronic devices fabricated by various materials can be developed.

While the present invention has been particularly shown and described with reference to exemplary implementations thereof using specific terms, the implementations and terms have been used to explain the present invention and should not be construed as limiting the scope of the present invention defined by the claims. Accordingly, it will be understood by those of ordinary skill in the technology that various changes in form and details may be made therein without departing from the spirit and scope of the present invention as defined by the following claims.

What is claimed is:

1. An apparatus for generating a terahertz (THz) wave, the apparatus comprising:
   a fiber optic probe, FOP, injecting an optical wave transmitted through an optical fiber into a device under test, DUT;
   a driving oscillator generating and injecting an electrical wave into the DUT;
   the DUT generating a THz wave using the injected optical and electrical waves;
   a signal divider dividing a signal generated by the DUT into a high frequency signal and a low frequency signal;
   a detecting unit detecting the generated THz wave using the high frequency signal; and
   a control unit controlling a distance between the FOP and the DUT using the low frequency signal.

2. The apparatus of claim 1, wherein the fiber optic probe injects the optical wave in a direction crossing a direction in which the electrical wave is injected.

3. The apparatus of claim 1, wherein the electrical wave is a millimeter wave or a sub-THz wave.

4. The apparatus of claim 1, wherein the detecting unit comprises:
   a converting unit converting the high frequency signal into an intermediate frequency signal; and
   a spectrum analyzer outputting a response to the intermediate frequency signal.

5. The apparatus of claim 1, wherein the control unit comprises:
   a precision parameter analyzer outputting a photocurrent using the low frequency signal;
   an amplifier amplifying the photocurrent;
   a controller outputting a predetermined control value according to an output of the amplifier; and
   an actuator adjusting a distance between the fiber optic probe and the DUT by controlling a position of the fiber optic probe according to the predetermined control value.

6. The apparatus of claim 1, wherein the fiber optic probe comprises:
   a waveguide guiding the optical wave without loss;
   a tapered fiber; and
   a tip
   wherein the waveguide is connected to the optical fiber.

7. The apparatus of claim 6, wherein the tip has a diameter shorter than the wavelength of the optical wave.

8. A method of generating a terahertz (THz) wave, the method comprising:
   setting a reference point to adjust a distance between a device under test, DUT, and a fiber optic probe, FOP;
   positioning the FOP at the reference point, and injecting an optical wave in a first direction into the FOP to scan the DUT while injecting an electrical wave in a second direction into the DUT to generate a THz wave;
   dividing a signal generated by the DUT into a high frequency signal and a low frequency signal;
   determining whether the THz wave has been generated using the high frequency signal; and
   adjusting a distance between the FOP and the DUT by controlling a position of the FOP using the low frequency signal.

9. The method of claim 8, wherein the electrical wave is a millimeter wave or a sub-THz wave.

* * * * *